(12) United States Patent
Kobayashi et al.

(10) Patent No.: US 6,670,860 B2
(45) Date of Patent: Dec. 30, 2003

(54) OSCILLATOR AND CONTROL METHOD FOR CONTROLLING THE OSCILLATOR

(75) Inventors: Yoshihiro Kobayashi, Komagane (JP); Takashi Endo, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/871,902

(22) Filed: Jun. 4, 2001

(65) Prior Publication Data

US 2002/0017961 A1 Feb. 14, 2002

(30) Foreign Application Priority Data

Jul. 31, 2000  (JP) ...................................... 2000-231675

(51) Int. Cl.[7] ................................................ H03B 5/32
(52) U.S. Cl. ......................... 331/158; 331/185; 331/55
(58) Field of Search ................................. 331/158, 160, 331/175, 172, 185, 74, 55, 46

(56) References Cited

U.S. PATENT DOCUMENTS

| | | | |
|---|---|---|---|
| 4,282,496 A | * 8/1981 | Heuner | ................. 331/116 FE |
| 4,307,354 A | 12/1981 | Miyagawa et al. | .... 331/116 FE |
| 4,613,829 A | * 9/1986 | Ott | ............................... 331/59 |
| 5,369,377 A | * 11/1994 | Benhamida | ................... 331/49 |
| 6,011,445 A | * 1/2000 | Nikhade et al. | ............. 331/173 |
| 6,133,801 A | * 10/2000 | Tanaka | ........................ 331/158 |

FOREIGN PATENT DOCUMENTS

| | | | | |
|---|---|---|---|---|
| EP | 0 987 822 A2 | 3/2000 | | |
| GB | 2312574 A | * 10/1997 | ............ | H03B/5/06 |
| JP | 53-143152 | 12/1978 | | |

* cited by examiner

*Primary Examiner*—Robert Pascal
*Assistant Examiner*—Kimberly E Glenn
(74) *Attorney, Agent, or Firm*—Oliff & Berridge, PLC

(57) ABSTRACT

The invention provides an oscillator and a control method for controlling the oscillator which reliably oscillates even when the oscillator is driven at a low voltage. An oscillator repeats a startup operation and a suspension of the startup operation by turning on and off a switch with half a period of a Schmitt trigger oscillator circuit, until a piezoelectric oscillator circuit is put into a normal oscillation state. The oscillator thus creates a number of opportunities of transient response allowing the oscillation amplitude of the piezoelectric oscillator circuit to grow, and reliably oscillates.

9 Claims, 8 Drawing Sheets

[FIG. 1]
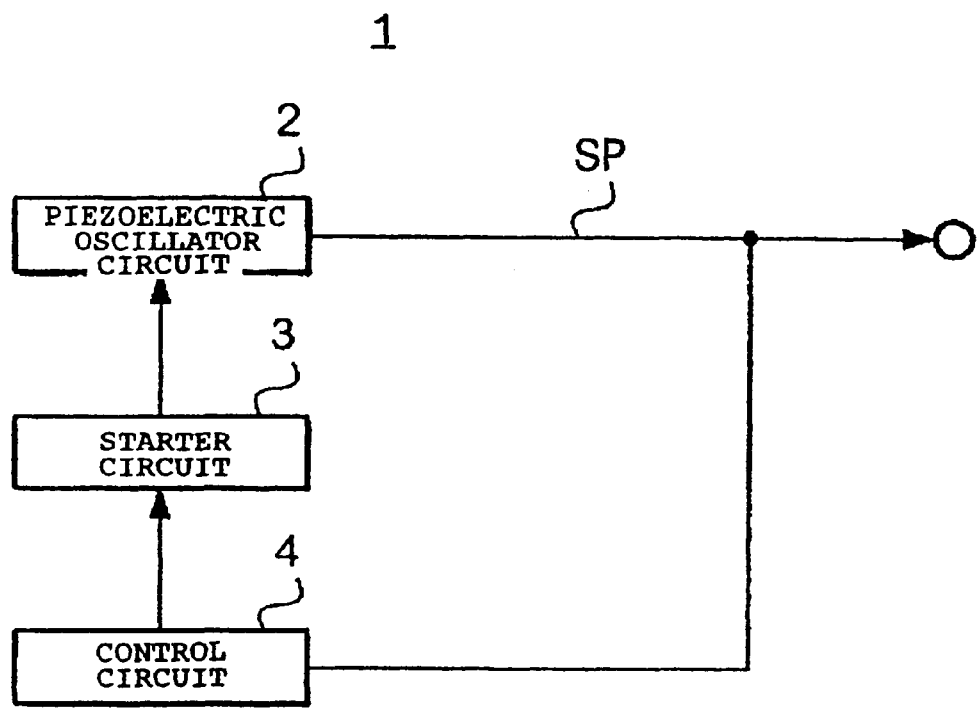

[FIG. 2]
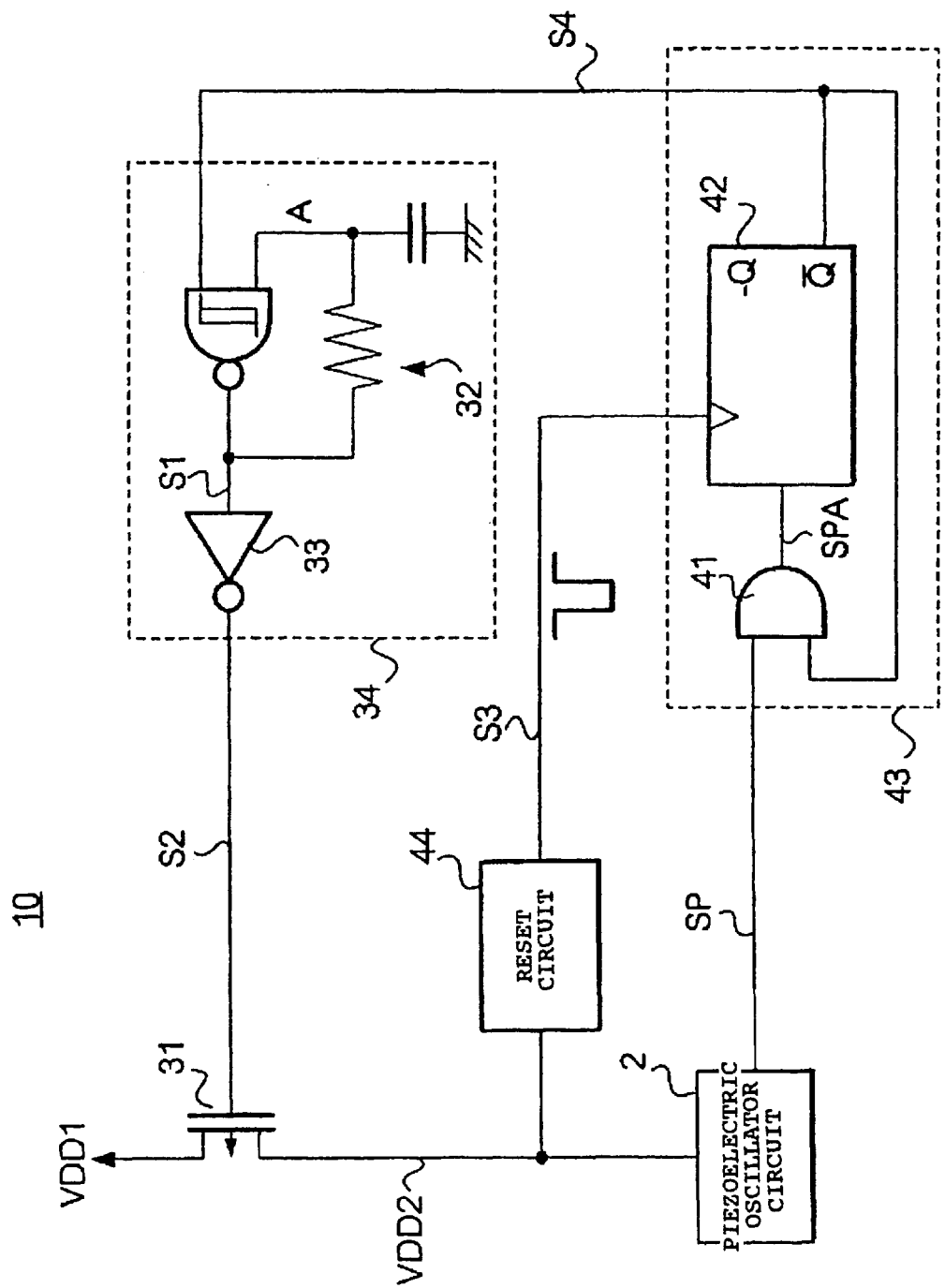

[FIG. 3]
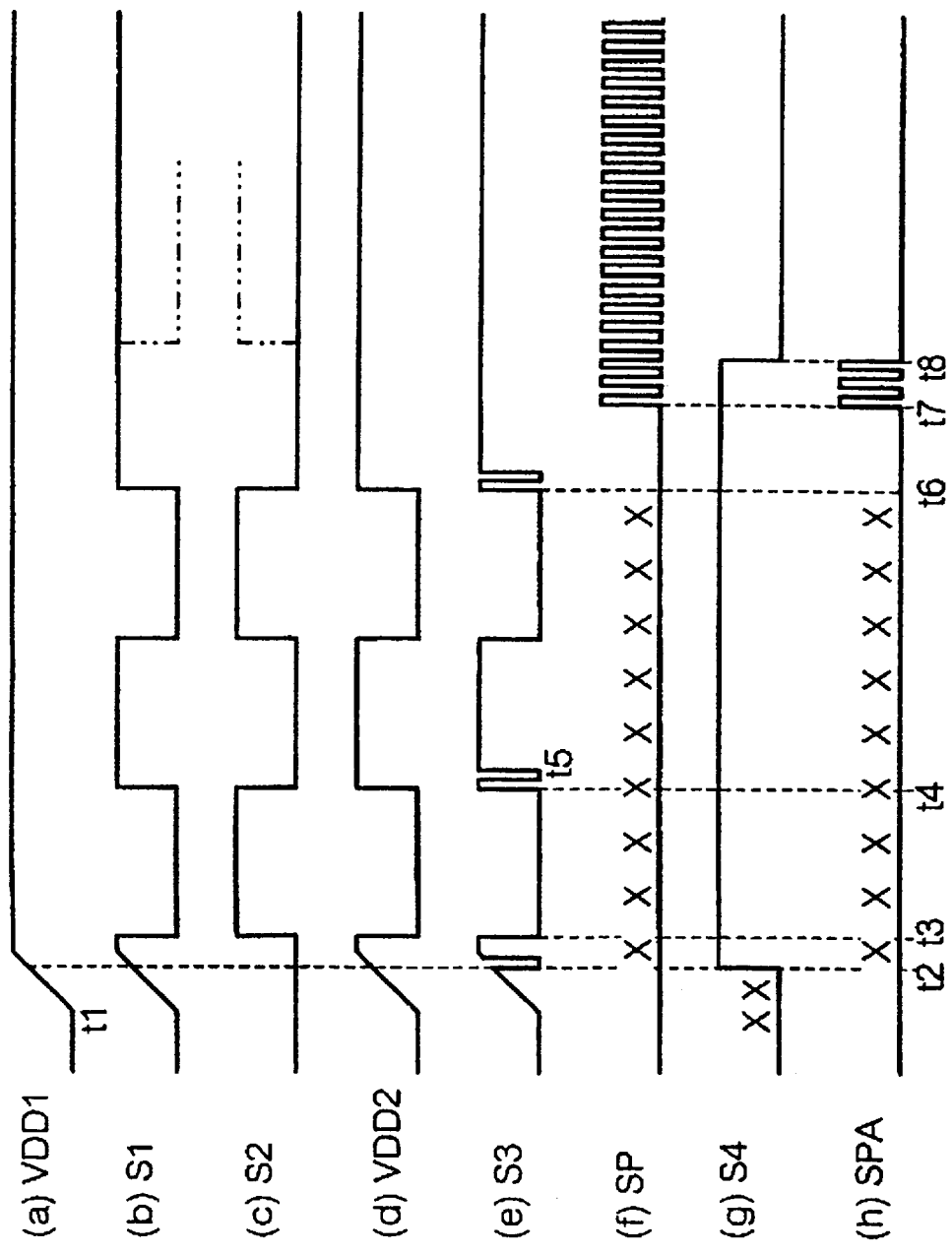

[FIG. 4]
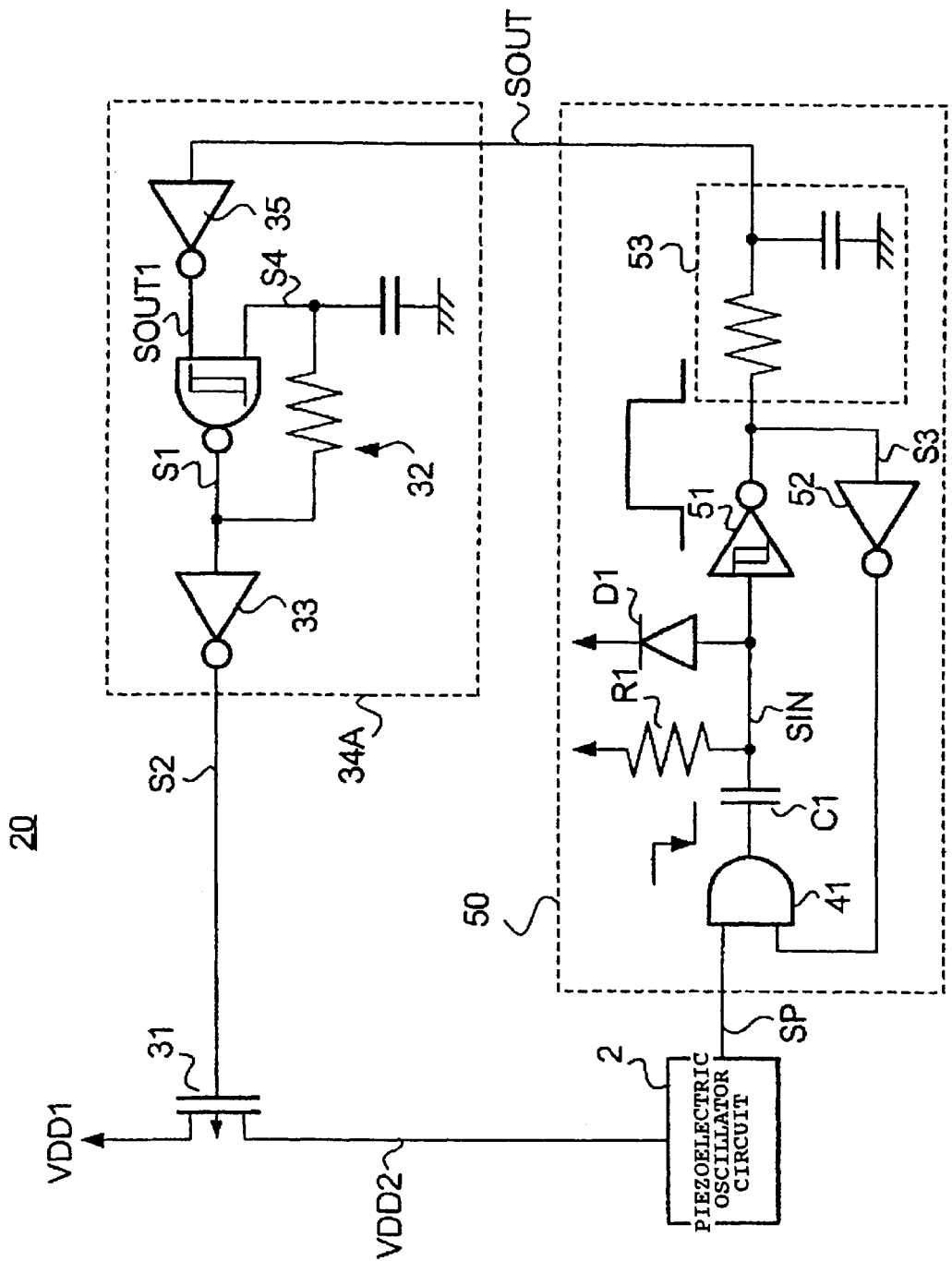

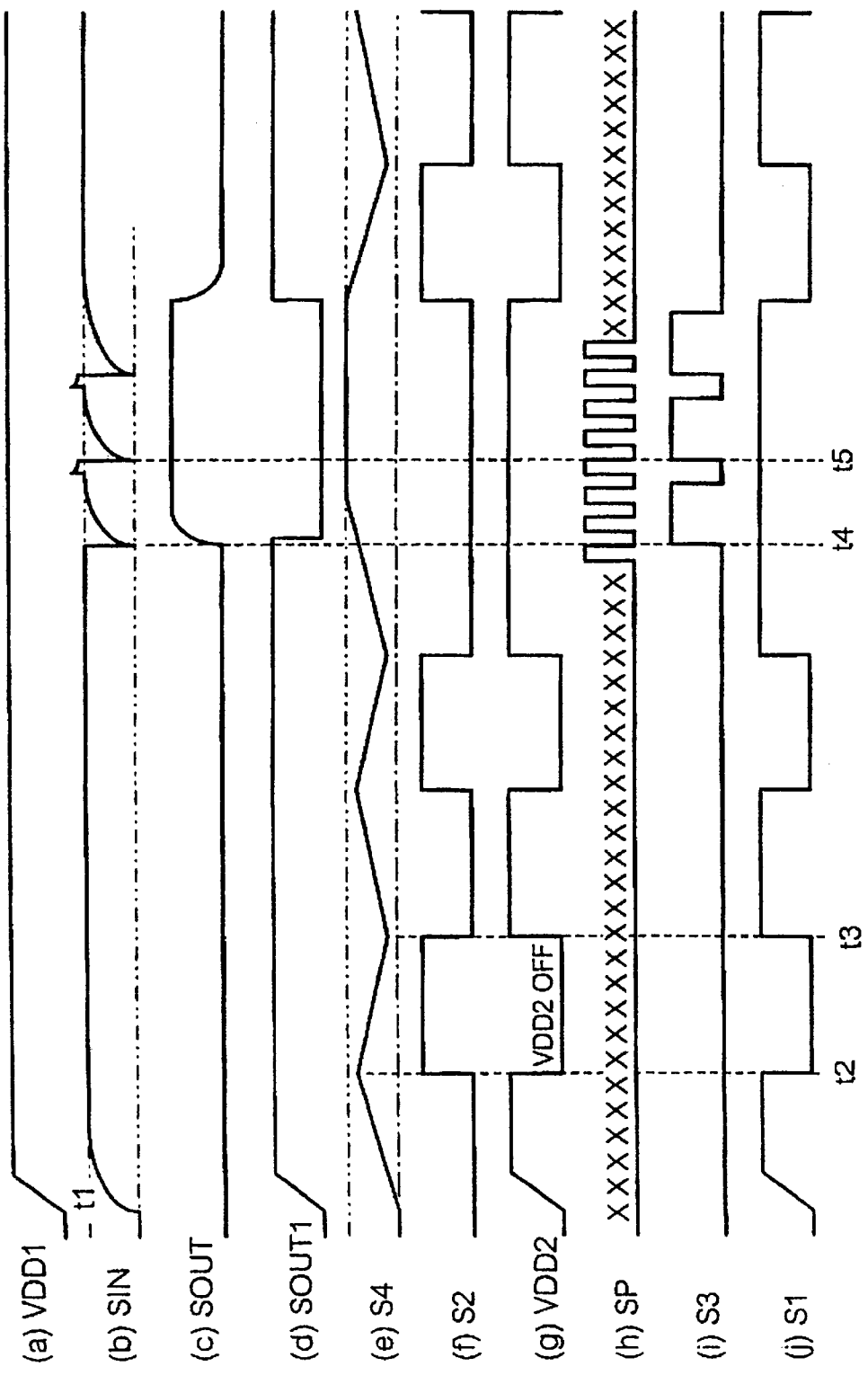
[FIG. 5]

[FIG. 6]
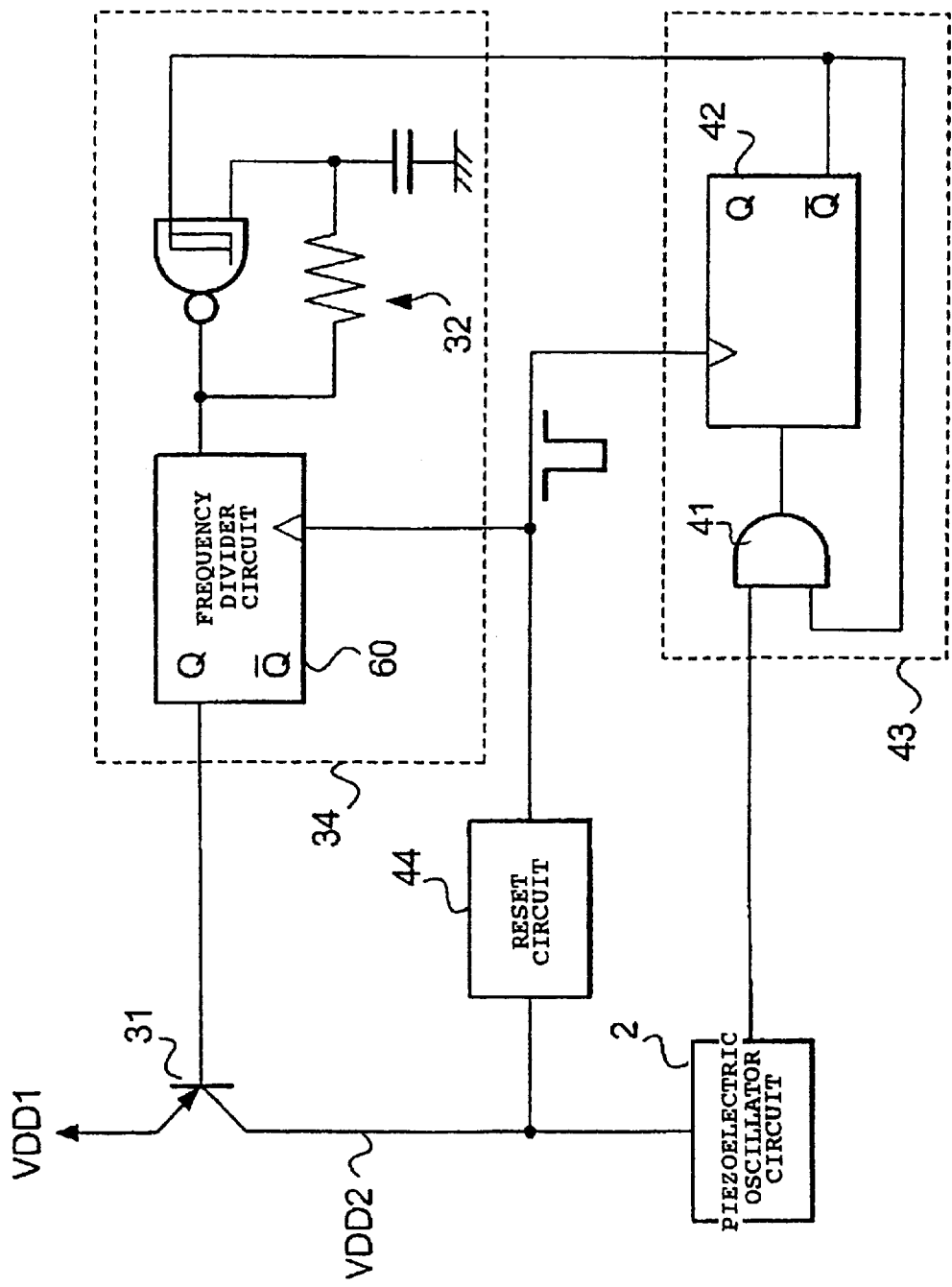

[FIG. 7]
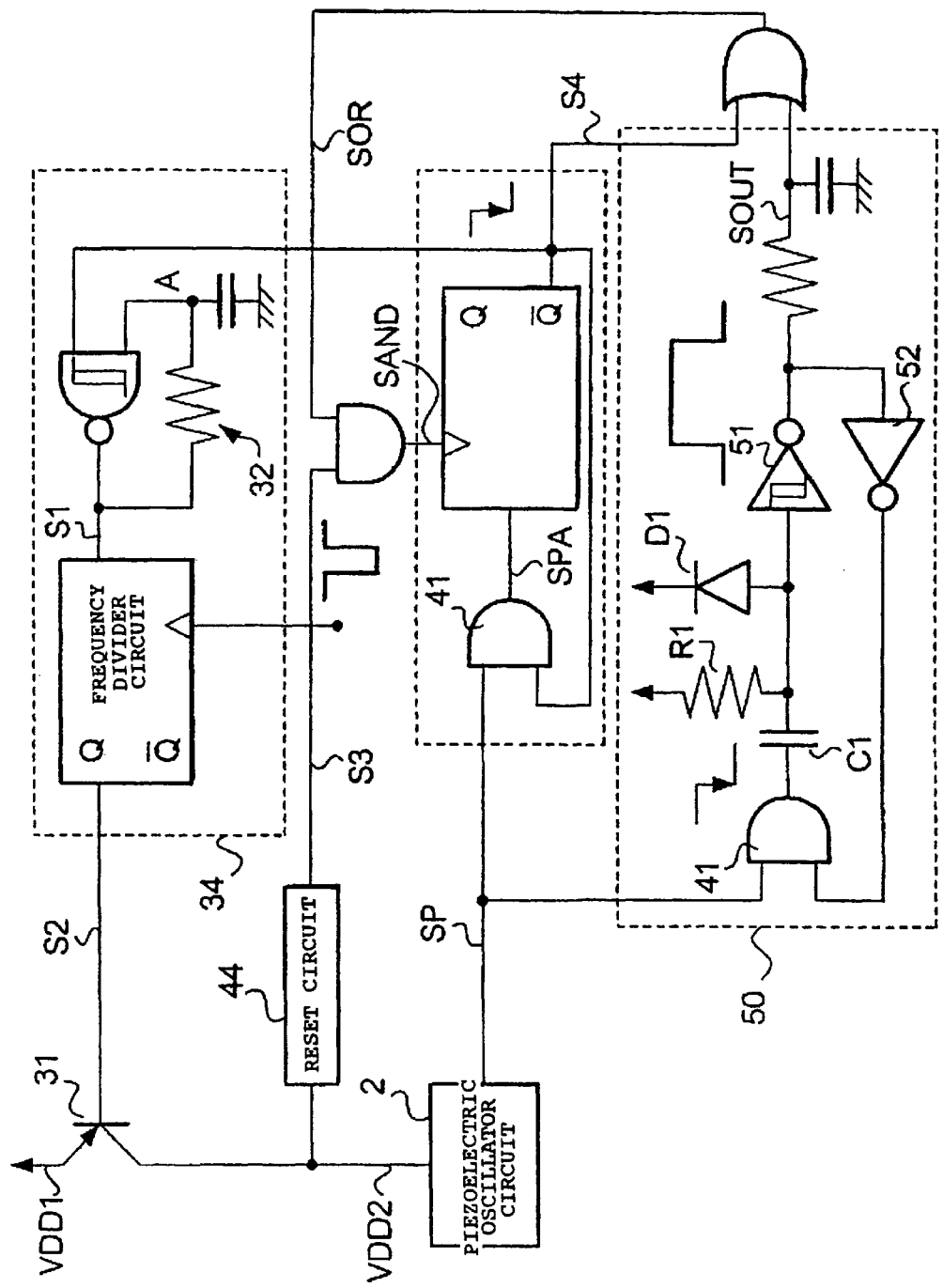

[FIG. 8]
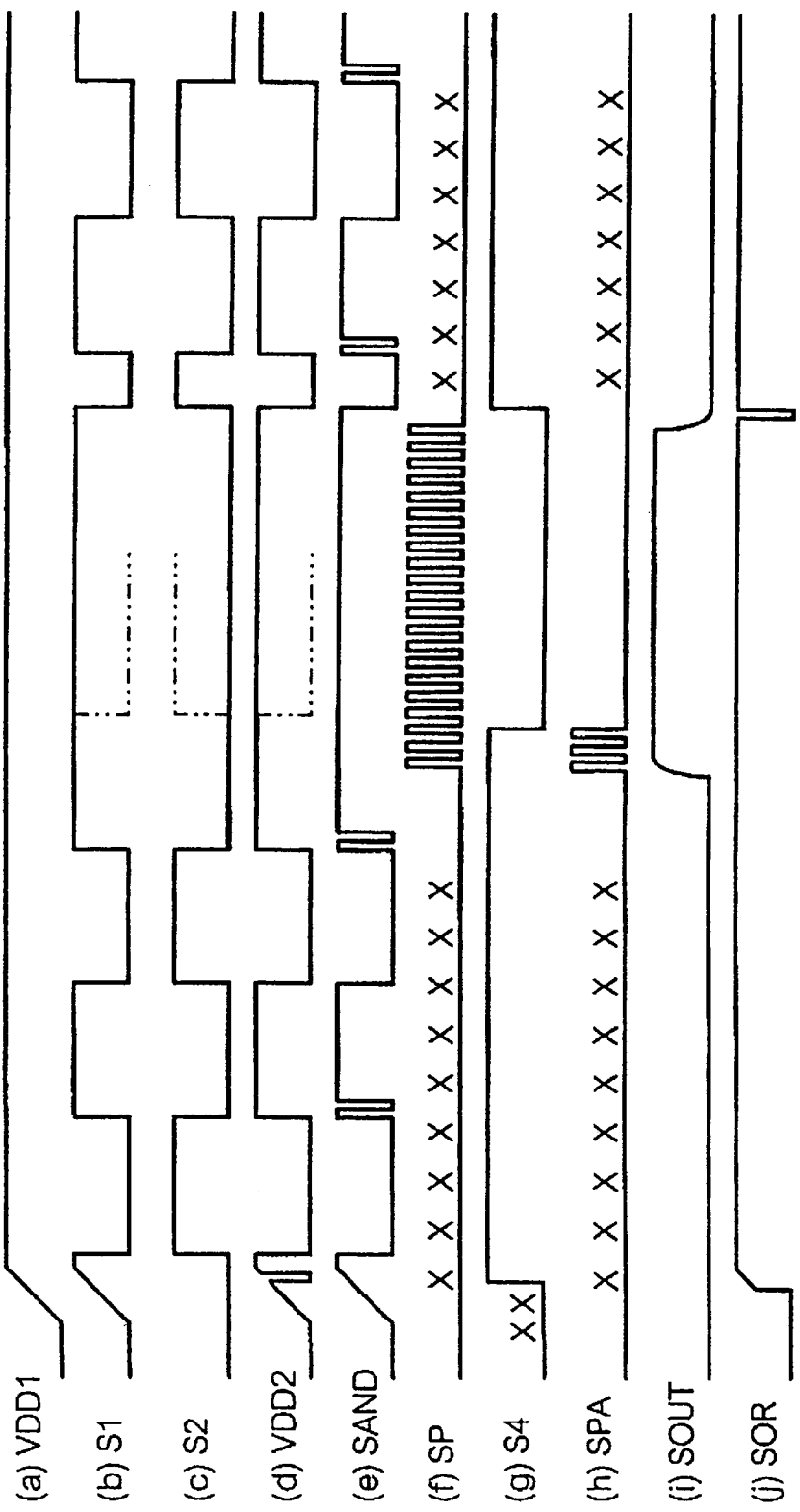

OSCILLATOR AND CONTROL METHOD FOR CONTROLLING THE OSCILLATOR

BACKGROUND OF THE INVENTION

1. Field of Invention

The present invention relates to an oscillator and a control method for controlling the oscillator, and more particularly, to an oscillator and a control method for controlling the oscillator which is for use in electronic equipment, such as a power-saving mobile telephone.

2. Description of Related Art

Electronic equipment can use a low power source voltage, and include circuits that only require low drive voltage, which saves power. Thus, an oscillator used in the electronic equipment can be driven at a voltage lower than that in conventional equipment.

As the voltage used for driving the oscillator decreases, however, the oscillator becomes more subject to operation environments, such as noise environments, power source environments, temperature environments, vibration environments, as well as variations in components. The oscillator remains unable to begin oscillating with an oscillation amplitude that does not grow at the start of oscillation, or remains unstable in the oscillation state thereof, although the probability of such troubles is very low.

In such a case, electronic equipment that includes the oscillator may not operate normally.

Particularly in electronic equipment, such as a mobile telephone, which intermittently repeats receiving operations for power saving, the number of start-ups of the oscillator is high, and the probability of aborted oscillation becomes high. It is therefore preferable to incorporate a preventive step in the oscillator.

SUMMARY OF THE INVENTION

The object of the present invention is to provide an oscillator and a control method for controlling the oscillator which reliably oscillates, even when the oscillator is driven at a low voltage.

To resolve the above problem, the present invention is an oscillator that includes an oscillator circuit, a driver that prompts the oscillator circuit to start oscillating by repeatedly performing drive control and drive stop control to the oscillator circuit, and a controller that controls the driver to prompt the oscillator circuit to start oscillating when the oscillator circuit is not oscillating, and that maintains the oscillator circuit in a driven state when the oscillator circuit is oscillating.

In the arrangement of the present invention, when the driver prompts the oscillator circuit to start oscillating, the controller controls the driver to continuously prompt the oscillator circuit to start oscillating based on the determination that the oscillator circuit is not oscillating when the count of the pulses of a pulse signal output from the oscillator circuit counted by the controller fails to reach a predetermined value during the drive control of the oscillator circuit, and the controller maintains the oscillator circuit in a driven state based on the determination that the oscillator circuit is oscillating when the count reaches the predetermined value.

In the arrangement of the present invention, the controller controls the driver to continuously prompt the oscillator circuit to start oscillating when no pulse signal output from the oscillator circuit is detected, and controls the driver to maintain the oscillator circuit in a driven state for a predetermined duration of time each time the pulse signal is detected.

In the arrangement of the present invention, the driver includes a switching device arranged on one of power supply lines to the oscillator circuit, and a switch controller that controls the switching device for on/off control with a period longer than the period of the pulse signal of the oscillator.

In the arrangement of the present invention, a control method for controlling an oscillator having an oscillator circuit, includes the steps of prompting the oscillator circuit to start oscillating by repeatedly performing drive control and drive stop control to the oscillator circuit when the oscillator circuit is not oscillating, and maintaining the oscillator circuit in a driven state when the oscillator circuit is oscillating.

In the arrangement of the present invention, in the control method for controlling an oscillator, the step for prompting the oscillator circuit to start oscillating includes repeatedly performing drive control and drive stop control to the oscillator circuit based on the determination that the oscillator circuit is not oscillating when the count of pulses of a pulse signal output from the oscillator circuit fails to reach a predetermined value during the drive control of the oscillator circuit, and maintaining the oscillator circuit in a driven state based on the determination that the oscillator circuit is oscillating when the count has reached the predetermined value.

In the arrangement of the present invention, the control method for controlling an oscillator circuit, the step for prompting the oscillator circuit to start oscillating includes repeatedly performing drive control and drive stop control to the oscillator circuit when no pulse signal is detected, and maintaining the oscillator circuit in a driven state for a predetermined duration of time each time the pulse signal is detected.

BRIEF DESCRIPTION OF THE DRAWINGS

FIG. 1 is a block diagram schematically showing the structure of an oscillator of the present invention;

FIG. 2 is a block diagram showing the structure of an oscillator of a first embodiment of the present invention;

FIGS. 3(a)–3(h) are timing charts of the oscillator;

FIG. 4 is a block diagram showing the structure of an oscillator of a second embodiment of the present invention;

FIGS. 5(a)–5(j) are timing charts showing the oscillator;

FIG. 6 is a block diagram showing the structure of one example of an oscillator in accordance with a first modification of the embodiments of the present invention;

FIG. 7 is a block diagram showing the structure of one example of an oscillator in accordance with a second modification of the embodiments of the present invention;

FIGS. 8(a)–8(j) are timing charts of the oscillator.

DETAILED DESCRIPTION OF PREFERRED EMBODIMENTS

Referring to the drawings as appropriate, the embodiments of the present invention are now discussed.

(1) Embodiments (1.1) Summary of the Embodiments

FIG. 1 is a block diagram schematically showing the structure of an oscillator of the present invention.

The oscillator 1 includes a piezoelectric oscillator circuit 2, a starter circuit (driver) 3 that repeatedly starts the piezoelectric oscillator circuit 2, and a control circuit 4 that controls the starter circuit 3.

When power is on in the oscillator 1, or when the standby state for oscillation is canceled in the oscillator 1, the starter circuit 3 feeds power to the piezoelectric oscillator circuit 2 to start oscillating.

In this case, the starter circuit 3 intermittently feeds power to the piezoelectric oscillator circuit 2 until the control circuit 4 detects a pulse signal SP output by the piezoelectric oscillator circuit 2. The piezoelectric oscillator circuit 2 thus repeats start and stop of oscillation.

When the control circuit 4 detects the pulse signal SP output by the piezoelectric oscillator circuit 2 in the oscillator 1, the starter circuit 3 maintains the piezoelectric oscillator circuit 2 in a driven state.

Specifically, when the piezoelectric oscillator circuit 2 fails to start oscillating in the oscillator 1, the startup operation for the piezoelectric oscillator circuit 2 is repeated so that the state for facilitating the start of the piezoelectric oscillator circuit 2 develops, i.e., a number of opportunities of transient response allowing the oscillation amplitude of the piezoelectric oscillator circuit 2 to grow are created to cause the piezoelectric oscillator circuit 2 to reliably oscillate.

The oscillator 1 thus reliably oscillates even when the piezoelectric oscillator circuit 2 has difficulty in oscillating under the influence of operation environments, such as noise environments, power source environments, temperature environments, and vibration environments, as well as variations in components.

The oscillator 1 not only causes the piezoelectric oscillator circuit 2 to reliably oscillate at the startup as described above, but also causes the control circuit 4 to continuously monitor a pulse signal SP output from the piezoelectric oscillator circuit 2 to detect an interruption of the oscillation of the piezoelectric oscillator circuit 2. When the oscillation is interrupted, the state under which the piezoelectric oscillator circuit 2 is easy to oscillate is created so that the oscillation state is reliably restored.

The embodiments of the oscillator are now specifically discussed.

(1.2) First Embodiment

FIG. 2 is a block diagram showing the construction of an oscillator of a first embodiment of the present invention.

In an oscillator 10, the starter circuit 3 shown in FIG. 1 includes a switch (a P-channel FET) 31 in a power supply line of the piezoelectric oscillator circuit 2, and a start drive circuit 34 that includes a Schmitt trigger oscillator circuit 32 and an inverter 33.

The control circuit 4 shown in FIG. 1 includes an oscillation start detector circuit 43 that includes an AND circuit 41 and a counter 42, and a reset circuit 44 which resets the counter 42 when the piezoelectric oscillator circuit 2 is supplied with a power source voltage VDD2. The counter 42 drives an inverted output terminal $\overline{Q}$ thereof from high to low at the moment the count of the counter 42 reaches a predetermined value.

The operation of the oscillator 10 is now discussed, with reference to a timing charts shown in FIGS. 3(a)–3(h).

Referring to FIG. 3(a), when the power source voltage VDD1 is supplied in the oscillator 10 at time t1, the Schmitt trigger oscillator circuit 32 is at a low level at point A shown in FIG. 2. Referring to FIG. 3(b), the output signal S1 of the Schmitt trigger oscillator circuit 32 is driven high, and the start drive circuit 34 outputs a low-level switch control signal S2 as shown in FIG. 3(c).

When the oscillator 10 is supplied with the power source voltage VDD1, the switch control signal S2 turns on the switch 31, and a power source voltage VDD2 is thus fed to the piezoelectric oscillator circuit 2 to start it as shown in FIG. 3(d).

When the switch 31 is turned on, the reset circuit 44 outputs a reset signal S3 at time t2 as shown in FIG. 3(e), thereby resetting the counter 42 of the oscillation start detector circuit 43 as shown in FIG. 3(g) and driving high the output level S4 at the inverted output terminal $\overline{Q}$.

In this way, the Schmitt trigger oscillator circuit 32 of the start drive circuit 34 starts oscillating, and one of the input terminals of the AND circuit 41 of the oscillation start detector circuit 43 is driven high. When the piezoelectric oscillator circuit 2 outputs the pulse signal SP, the counter 42 counts pulses of the pulse signal SP, starting from zero.

When the piezoelectric oscillator circuit 2 fails to start oscillating for any reason, or when piezoelectric oscillator circuit 2 fails to start oscillating immediately subsequent to the supply of the power source voltage VDD2 because of an unstable operation thereof as shown in FIG. 3(f), the output signal S1 of the Schmitt trigger oscillator circuit 32 is driven low before the count of the counter 42 reaches a predetermined value as shown in FIG. 3(b) (time t3). The letters "X"s shown in FIGS. 3(f)–3(h) represent that no pulse signal SP is output.

As a result, as shown in FIG. 3(c), the switch control signal S2 is transitioned to a high level at time t3. The switch 31 is turned off, thereby cutting off the supply of the power source voltage VDD2 to the piezoelectric oscillator circuit 2 to stop the start of the piezoelectric oscillator circuit 2 (FIG. 3(d)).

Specifically, when the count of the counter 42 fails to reach the predetermined value while the piezoelectric oscillator circuit 2 is driven, the supply of the power source voltage VDD2 to the piezoelectric oscillator circuit 2 is suspended to stop the driving of the piezoelectric oscillator circuit 2 based on the determination that the piezoelectric oscillator circuit 2 is not oscillating.

Since the output level S4 at the inverted output terminal $\overline{Q}$ of the counter 42 is maintained high as shown in FIG. 3(g), the oscillation of the Schmitt trigger oscillator circuit 32 continues, the output signal S1 is again transitioned high (FIG. 3(b)) at time t4, and the switch control signal S2 is transitioned low (FIG. 3(c)).

In this way, the switch 31 is turned on when half the period of the Schmitt trigger oscillator circuit 32 has elapsed subsequent to the switch 31 being turned off. To restart the piezoelectric oscillator circuit 2, the power source voltage VDD2 is fed to the piezoelectric oscillator circuit 2 (FIG. 3(d)).

As shown in FIG. 3(e), the reset signal S3 is output by the reset circuit 44 at time t5, thereby resetting the counter 42 of the oscillation start detector circuit 43. Consequently, when the piezoelectric oscillator circuit 2 outputs the pulse signal SP, the counter 42 starts counting the pulse signal SP from zero.

In this way, in the oscillator 10, the piezoelectric oscillator circuit 2 is started depending on the output signal S1 of the Schmitt trigger oscillator circuit 32. If the count of pulses of the pulse signal SP output from the piezoelectric oscillator circuit 2 fails to reach the predetermined value by the time the level of the output signal S1 is inverted (within half the period thereof) subsequent to the start-up of the piezoelectric oscillator circuit 2, the start of the piezoelectric oscillator circuit 2 is suspended. When the level of the output signal S1 is inverted again, the start-up operation of the piezoelectric oscillator circuit 2 is repeated again.

Specifically, when the count fails to reach the predetermined value with the piezoelectric oscillator circuit 2 driven because of a failure to normally operate, the startup and the suspension of the startup of the piezoelectric oscillator circuit 2 are repeated with half the period of the Schmitt trigger oscillator circuit 32 to prompt oscillation.

In this way, until the piezoelectric oscillator circuit 2 normally oscillates, the oscillator 10 creates a state in which the piezoelectric oscillator circuit 2 easily starts oscillating, namely, a number of opportunities of transient response allowing the oscillation amplitude of the piezoelectric oscillator circuit 2 to grow. The oscillator 10 is reliably oscillated even when driven at a low voltage.

After the oscillator 10 restarts the piezoelectric oscillator circuit 2 at time t6, the piezoelectric oscillator circuit 2 normally operates at time t7. When the counter 42 counts the pulses of the pulse signal SP of the piezoelectric oscillator circuit 2 and reaches the predetermined value (at time t8), the output signal S4 of the inverted output terminal $\overline{Q}$ of the counter 42 is transitioned to a low level (FIG. 3(g)), and the Schmitt trigger oscillator circuit 32 stops oscillating, thereby maintaining the connection state of the switch 31 in an on state.

As a result, the power source voltage VDD2 is continuously fed to the piezoelectric oscillator circuit 2, keeping the piezoelectric oscillator circuit 2 in a driven state. The piezoelectric oscillator circuit 2 thus continuously outputs the pulse signal SP.

(1.3) Second Embodiment

FIG. 4 is a block diagram showing the structure of an oscillator of a second embodiment of the present invention.

An oscillator 20 remains identical in structure to the oscillator 10 of the first embodiment, except that the oscillator 20 includes a different circuit arrangement in the control circuit 4 and an inverter 35 added to the signal input side of a start drive circuit 34A. Like components are designated with like reference numerals, and the discussion thereof is not repeated.

In the oscillator 20, the control circuit 4 (an oscillation stop detector circuit 50) includes a capacitor C1, a pull-up resistor R1, and a diode D1 between an AND circuit 41 and a Schmitt inverter 51. The output signal S3 of the Schmitt inverter 51 is fed to one of the input terminals of the AND circuit 41 through an inverter 52. The control circuit 4 further includes a CR integrator circuit 53 for integrating the output signal S3 of the Schmitt inverter 51.

The operation of the oscillator 20 is now discussed with reference to the timing charts shown in FIGS. 5(a)–5(j).

In the oscillator 20, when a power source voltage VDD1 is supplied at time t1 as shown in FIG. 5(a), the output signal S1 of the Schmitt trigger oscillator circuit 32 is transitioned high (FIG. 5(a)) in the same manner as in the first embodiment, the start drive circuit 34A outputs a low-level switch control signal S2 (FIG. 5(f)), the switch 31 is turned on, and the power source voltage VDD2 is fed to the piezoelectric oscillator circuit 2 to start the piezoelectric oscillator circuit 2 (FIG. 5(g)).

As shown in FIG. 5(b), in the oscillation stop detector circuit 50, an input signal SIN of the Schmitt inverter 51 is pulled up to a high level through the pull-up resistor R1, and a low-level output signal SOUT is fed to the inverter 35 of the start drive circuit 34A through the CR integrator circuit 53, as shown in FIG. 5(c). In this way, the Schmitt trigger oscillator circuit 32 starts oscillating.

When a feedback signal S4 of the Schmitt trigger oscillator circuit 32 exceeds a predetermined level (substantially to a high level) at time t2 as shown in FIG. 5(g) in the event of an aborted oscillation of the piezoelectric oscillator circuit 2, the start drive circuit 34A outputs a high-level switch control signal S2 as shown in FIG. 5(f). The switch 31 is turned off, thereby cutting off the supply of the power source voltage VDD2 to the piezoelectric oscillator circuit 2(FIG. 5(g)).

At the moment the output signal S1 of the Schmitt trigger oscillator circuit 32 is transitioned high as shown in FIG. 5(j) at time t3, the start drive circuit 34A outputs a low-level switch control signal S2 as shown in FIG. 5(f). The switch 31 is then turned on, thereby feeding the power source voltage VDD2 to the piezoelectric oscillator circuit 2 to start the piezoelectric oscillator circuit 2 (FIG. 5(g)).

Referring to FIG. 5(h), the piezoelectric oscillator circuit 2 in the oscillator 20 normally starts oscillating at time t4 (time t5), outputting the pulse signal SP. The input signal SIN to the Schmitt inverter 51 is transitioned low in response to the falling edge of the pulse signal SP. Referring to FIG. 5(b), a one-shot pulse having a time constant determined by the capacitor C1 and the pull-up resistor R1 is input to the Schmitt inverter 51.

In this case, the one-shot pulse in the inverted version thereof is smoothed (integrated) by the CR integrator circuit 53, and the high-level output signal SOUT is then fed to the start drive circuit 34A.

While the one-shot pulse is output, the Schmitt trigger oscillator circuit 32 stops oscillating, thereby keeping the switch 31 in an on state. In this way, the power source voltage VDD is continuously fed to the piezoelectric oscillator circuit 2 to allow the piezoelectric oscillator circuit 2 to continuously output the pulse signal SP.

In this way, until the piezoelectric oscillator circuit 2 outputs the pulse signal SP, the oscillator 20 repeats the startup control and the suspension control of startup of the piezoelectric oscillator circuit 2 based on the output signal S1 of the Schmitt trigger oscillator circuit 32. Like the first embodiment, the second embodiment creates the state in which the piezoelectric oscillator circuit 2 easily starts oscillating, namely, a number of opportunities of transient response allowing the oscillation amplitude of the piezoelectric oscillator circuit 2 to grow. The oscillator 10 is reliably oscillated even when driven at a low voltage.

The oscillator 20 maintains the connection state of the switch 31 in an on state only while the one-shot pulse is output based on the pulse signal SP of the piezoelectric oscillator circuit 2. Therefore, the piezoelectric oscillator circuit 2 is quickly and reliably oscillated even when the oscillation of the pulse signal SP is followed by an interruption of the oscillation.

(2) Modifications (2.1) First Modification

In the preceding embodiments, the interval within which the startup of the piezoelectric oscillator circuit is repeated depends on the oscillation period of the Schmitt trigger oscillator circuit 32. For example, as shown in FIG. 6, the interval of repeated startup of the piezoelectric oscillator circuit 2 is easily set to be a desired time interval by arranging a frequency divider circuit 60 in succession to the Schmitt trigger oscillator circuit 32.

The preceding embodiments have been discussed in conjunction with the use of MOS transistor switch 31. Alternatively, widely available switching elements, such as a bipolar transistor shown in FIG. 6, may be employed.

(2.2) Second Modification

In the above discussion of the first embodiment, the reset circuit 44 that resets the counter 42 is used to control the startup of the piezoelectric oscillator circuit 2. As shown in FIG. 7, a second modification of the present invention includes the oscillation stop detector circuit 50 of the oscillator 20 of the second embodiment added to the oscillator 10 of the first embodiment. The second modification thus resets a count 32 by an ANDed signal SAND of a reset signal S3 and an ORed signal SOR which is obtained by ORing an output signal SOUT of the oscillation stop detector circuit 50 and an output signal S4 of the oscillation start detector circuit 43. The piezoelectric oscillator circuit 2 is thus started again not only at the power on but also when the oscillation is followed by a subsequent interruption.

In addition to the operation of the oscillator 10 of the first embodiment for reliably starting oscillation, the oscillator of the second modification performs the operation of the oscillator 20 of the second embodiment in which the oscillator is oscillated in the event that once started oscillation is interrupted.

FIGS. 8(a)–8(j) are timing charts showing the operation of the oscillator. Since the oscillator combines the operation of the oscillator 10 of the first embodiment and the operation of the oscillator 20 of the second embodiment as already discussed, the discussion of the preceding embodiments is also referred to.

(2.3) Third Modification

In the preceding embodiments, the piezoelectric oscillator circuit 2 is oscillated by being repeatedly subjected to startup control only when no oscillation state occurs, or when the piezoelectric oscillator circuit 2 fails to oscillate in a reliable fashion. The present invention is not limited to these cases. For example, when the piezoelectric oscillator circuit happens to oscillate in a third-order vibration mode rather than in a first-order vibration mode which is originally intended, the piezoelectric oscillator circuit 2 is repeatedly subjected to startup control to revert back to the normal oscillation state.

To cope with this problem, a method in accordance with the first embodiment may be used to restart the piezoelectric oscillator circuit 2 into oscillation when the count of the counter 42 fails to reach the predetermined value or is out of a predetermined range. Also a method in accordance with the first embodiment may be used to restart the piezoelectric oscillator circuit 2 into oscillation when the frequency of the pulse signal SP of the piezoelectric oscillator circuit 2 is frequency-voltage converted and the converted voltage falls outside a predetermined voltage range.

As described above, the present invention causes an oscillator to reliably oscillate when the oscillator is driven at a low voltage.

What is claimed is:

1. An oscillator, comprising:
an oscillator circuit;
a driver that prompts the oscillator circuit to start oscillating by repeatedly performing drive control and drive stop control to the oscillator circuit and comprises a trigger oscillator circuit; and
a controller that controls the driver to oscillate the trigger oscillator circuit and to prompt the oscillator circuit to oscillate when the oscillator circuit is not oscillating, and that stops oscillation of the trigger oscillator circuit and maintains the oscillator circuit in a driven state when the oscillator circuit is oscillating.

2. The oscillator according to claim 1, further comprising a counter counting pulses of a pulse signal output from the oscillator circuit, and
when the driver prompts the oscillator circuit to start oscillating, the controller controls the driver to oscillate the trigger oscillator circuit and to continuously prompt the oscillator circuit to start oscillating based on the determination that the oscillator circuit is not oscillating when the count of pulses of a pulse signal output from the oscillator circuit counted by the counter fails to reach a predetermined value during drive control of the oscillator circuit, and
the controller stops oscillation of the trigger oscillator circuit and maintains the oscillator circuit in a driven state based on the determination that the oscillator is oscillating when the count reaches the predetermined value.

3. The oscillator according to claim 1,
the controller controls the driver to oscillate the trigger oscillator circuit and to continuously prompt the oscillator circuit to start oscillating when no pulse signal output from the oscillator circuit is detected, and
controls the driver to stop oscillation of the trigger oscillator circuit and to maintain the oscillator circuit in a driven state for a predetermined duration of time each time the pulse signal is detected.

4. The oscillator according to claim 1, wherein the driver further comprises:
a switching device arranged on one of power supply lines to the oscillator circuit; and wherein a switch control signal output from the driver to the switching device controls the switching device for on/off control with a period longer than the period of the pulse signal of the oscillator circuit.

5. A control method for controlling an oscillator having an oscillator circuit, comprising the steps of:
prompting the oscillator circuit trough a driver comprising a trigger oscillator circuit to start oscillating by oscillating the trigger oscillator circuit and repeatedly performing drive control and drive stop control to the oscillator circuit when the oscillator circuit is not oscillating; and
stopping oscillation of the trigger oscillator circuit and maintaining the oscillator circuit in a driven state when the oscillator circuit is oscillating.

6. The control method for controlling an oscillator according to claim 5,
the step for prompting the oscillator circuit to start oscillating comprising:
counting pulses of a pulse signal output from the oscillator circuit;
oscillating the trigger oscillator circuit and repeatedly performing drive control and drive stop control to the oscillator circuit based on the determination that the oscillator circuit is not oscillating when the count of pulses of a pulse signal output from the oscillator circuit fails to reach a predetermined value during the drive control of the oscillator circuit; and
stopping oscillation of the trigger oscillator circuit and maintaining the oscillator circuit in a driven state based on the determination that the oscillator circuit is oscillating when the count has reached the predetermined value.

7. The control method for controlling an oscillator according to claim 5, the step for prompting the oscillator circuit to start oscillating comprising:
oscillating the trigger oscillator circuit and repeatedly performing drive control and drive stop control to the oscillator circuit when no pulse signal is detected; and
stopping oscillation of the trigger oscillator circuit and maintaining the oscillator circuit in a driven state for a predetermined duration of time each time the pulse signal is detected.

8. The oscillator according to claim 2, the controller comprising the counter.

9. An oscillator, comprising:

an oscillator circuit;

a starter circuit that feeds power to the oscillator circuit and comprises (1) a switching device arranged on one of power supply lines to the oscillator circuit and (2) a start drive circuit including a trigger oscillator circuit, wherein the start drive circuit generates a switch control signal to control switching of the switching device; and a control circuit that controls the starter circuit and comprises an oscillator start detector circuit that continuously monitors a pulse signal output from the oscillator circuit to detect oscillation of the oscillator circuit;

wherein when the oscillator start detector circuit detects that the oscillator circuit is not oscillating when power is supplied thereto through the switching device of the starter circuit, the control circuit controls the trigger oscillator circuit to oscillate and thereby generate the switch control signal from the start drive circuit that repeatedly and alternately switches the switching device between an on position supplying power to the oscillator circuit and an off position cutting power to the oscillator circuit, wherein the oscillator circuit is potentially started to oscillate each time the switching device supplies power thereto, and wherein when the oscillator start detector circuit detects that the oscillator circuit is oscillating following the supply of power thereto through the switching device of the starter circuit, the control circuit controls the trigger oscillator circuit to stop oscillating, thereby maintaining the switching device in the on position and maintaining oscillation of the oscillator circuit.

* * * * *